(12) United States Patent
Liao et al.

(10) Patent No.: US 7,214,070 B2
(45) Date of Patent: May 8, 2007

(54) ELECTRICAL CONNECTOR ASSEMBLY

(75) Inventors: Fang-Jwu Liao, Tu-Cheng (TW); Nick Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/430,503

(22) Filed: May 8, 2006

(65) Prior Publication Data

US 2006/0252288 A1 Nov. 9, 2006

(30) Foreign Application Priority Data

May 6, 2005 (TW) .............................. 94207292 U

(51) Int. Cl.
*H01R 12/00* (2006.01)
(52) U.S. Cl. ...................................................... 439/70
(58) Field of Classification Search ................. 439/70, 439/71, 72–73, 330–331, 525–526, 68–69, 439/493, 940
See application file for complete search history.

(56) References Cited

U.S. PATENT DOCUMENTS 6,753,474 B2 * 6/2004 Trout ........................... 174/66
6,805,562 B2 * 10/2004 Liao et al. .................... 439/68
6,908,316 B2 * 6/2005 Ma et al. ...................... 439/73
6,965,246 B2 * 11/2005 Gattuso et al. ............. 324/760
7,118,387 B2 * 10/2006 Wong .......................... 439/73
7,140,901 B2 * 11/2006 Lin et al. .................... 439/331
2002/0173179 A1 * 11/2002 Ito et al. ...................... 439/70

* cited by examiner

*Primary Examiner*—J. F. Duverne
(74) *Attorney, Agent, or Firm*—Wei Te Chung

(57) ABSTRACT

An electrical connector assembly includes a connector comprising a base with a plurality of passageways receiving a plurality of conductive contacts, a cover mounted on the base, the cover defining a plurality of through holes corresponding to the passageways, and an actuator for driving the cover to move from an open position to a closed position; a chip module mounted on the connector and including an abutting surface resting on the cover and a plurality of pins extending from the abutting surface. A first guiding device is defined on the chip module and a second guiding device is defined on the connector for engaging with the first guiding device along an engaging direction, and a length of the two guiding devices along the engaging direction is longer than that of the pins, and wherein the module is provided with a first guider and the connector is provided with a second guider, and the two guiders have different heights in the engaging direction.

13 Claims, 4 Drawing Sheets

ELECTRICAL CONNECTOR ASSEMBLY

BACKGROUND OF THE INVENTION

1. Field of the Invention

The present invention relates to an electrical connector, and more particularly to a zero insertion force electrical connector to provide electrical connection between an integrated circuit (IC) and a printed circuit board (PCB).

2. Background of the Invention

Zero Insertion Force (ZIF) electrical connectors are widely used for electrically connecting two electrical interfaces such as an electrical substrate, e.g. a PCB, and an integrated circuit (IC) package, e.g. a central processing unit (CPU).

Typical conventional ZIF connectors are disclosed in Chinese Patent Nos. 03262254.6, 03251142.6 and 03262254.6. Each of these connectors generally comprises a base connected to a PCB, a movable cover mounted on the base and a driving mechanism. The base includes a plurality of passageways and a plurality of conductive contacts received therein. The cover includes a plurality of through holes corresponding to said passageways in the base. The driving mechanism is used to drive the cover to move from an open position to a closed position. While the cover is at the open position, pins of the IC are inserted into the through holes of the cover and the passageways of the base. At this time, the pins do not contact with any conductive contacts. While the cover is at the closed position, the IC is electrically connected with the PCB by the pins contacting with the conductive contacts. Because the pins of the IC pass through the through holes of the cover for positioning the IC, it is important to ensure proper positioning. Moreover, while such a connector is in use, improper position of the IC pins damage the contacts. As a result, the reliability of the electrical connection may be affected.

Therefore, a new electrical connector to resolve the above-mentioned problems is desired.

SUMMARY OF THE INVENTION

Accordingly, an object of the present invention is to provide an electrical connector assembly for positioning a chip module accurately and expediently, which can avoid contacts being damaged while the IC was inclined during inserting into the connector. To achieve the above-mentioned object, in a preferred embodiment of the present invention, an electrical connector assembly is provided and comprises a base with a plurality of passageways receiving a plurality of conductive contacts, a cover mounted on the base, the cover defining a plurality of through holes corresponding to the passageways, an actuator for driving the cover to move from an open position to a closed position and a chip module mounted on the connector and including an abutting surface resting on the cover and a plurality of pins extending from the abutting surface, wherein a first guiding device is defined on the chip module and a second guiding device is defined on the connector for engaging with the first guiding device along an engaging direction, and a length of the two guiding devices along the engaging direction is longer than that of the pins, and wherein the module is provided with a first guider and the connector is provided with a second guider, and the two guiders have different heights in the engaging direction.

DETAILED DESCRIPTION OF THE PREFERRED EMBODIMENT OF

THE INVENTION

A preferred embodiment of the present invention will be described hereunder with reference to the accompanying drawings.

Referring to FIGS. 1–4, an electrical connector assembly 10 of the present invention is used for establishing an electrical connection between an IC package and a PCB and includes a connector 20 and a chip module 30 mounted onto the connector 20.

Figure 1:
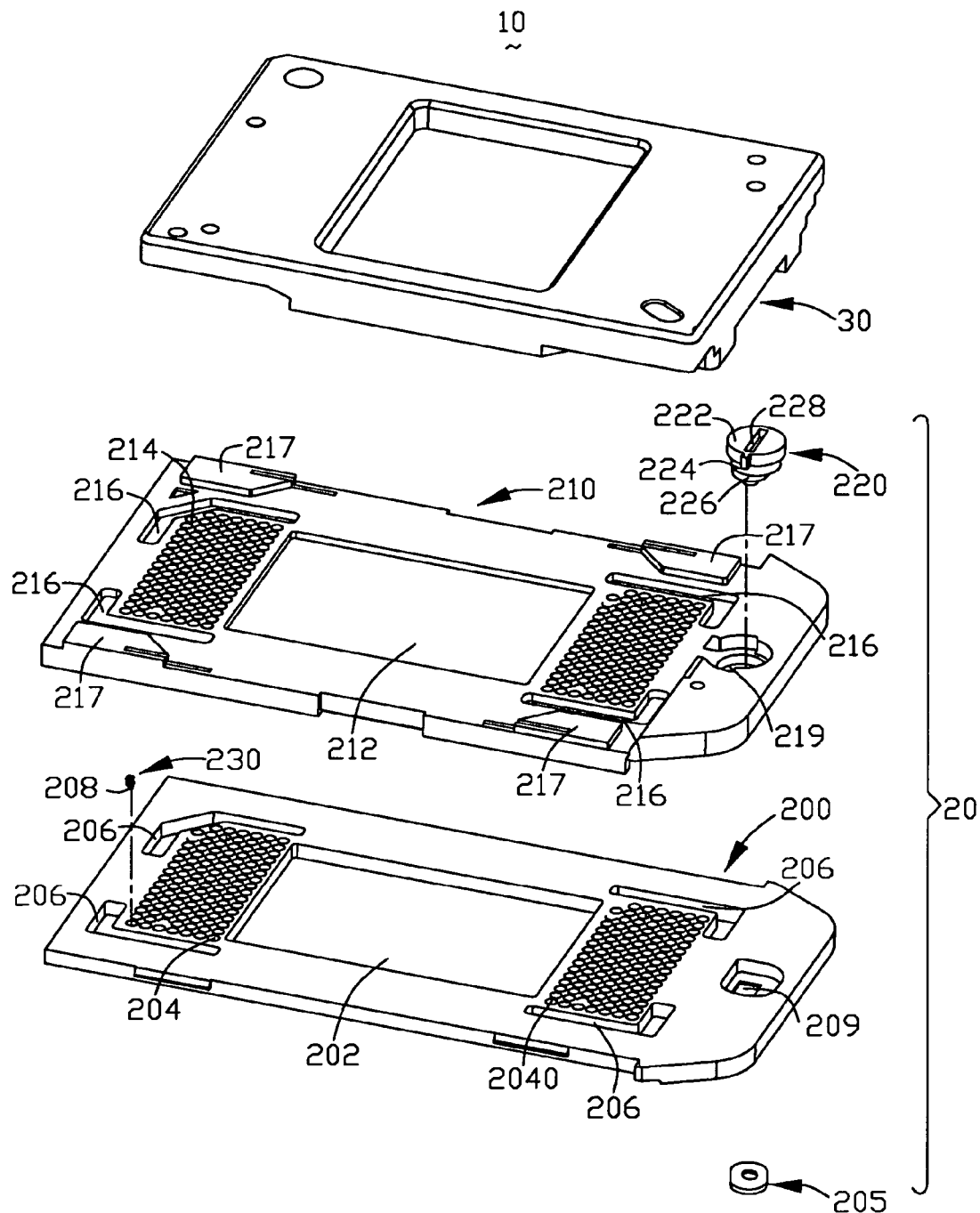
FIG. 1 is an exploded isometric view of an electrical connector assembly in accordance with a preferred embodiment of the present invention.

Referring to FIG. 1, the connector 20 comprises a base 200 connected to a PCB (not shown), a plurality of conductive contacts 230 correspondingly received in the base 200, a cover 210 movably mounted on the base 200 and an actuator 220 provided at one side of the base 200 and used to actuate the cover 210 to move from an open position to a closed position.

The base 200 is formed from insulative material and includes a first rectangular placket 202 disposed in a middle portion of the base 200, a conduction region 204 disposed at two sides of the first rectangular placket 202, and a plurality of first guide slots 206 disposed at an outside of the conduction region 204 through the base 200. The conduction region 204 defines a mounting surface (not shown) for mounting the connector to the PCB and a mating surface (not shown) opposite to the mounting surface. The conduction region defines a plurality of receiving cavities 204 in an array through the mounting surface to the mating surface and a plurality of conductive contacts 230 correspondingly received therein. Each contact 230 defines a soldering ball 208 extending from one end of contact 230 over the mounting surface for mounting the connector 20 onto the PCB. The other end of the contact 200 extends towards the mating surface of the base 200 for electrically connecting with the pins of the IC.

The first guide slot 206 is symmetrically disposed in the four corners outside of the conduction region 204. One of the first guide slots 206 is provided with a different configuration from others. In the preferred embodiment, the different first guide slot 206 defines an angled area for preventing mismating the chip module 30 to the connector. One side of the base defines a first receiving cavity 209 for receiving the actuator 220.

The cover 210 is formed from a dielectric material by insert molding. The cover defines a horizontal top surface for carrying the chip. A second placket 212 is formed in a center of the cover 210. The second placket 212 has a uniform shape and dimension as the first placket 202. Two sides of the second rectangular placket 212 define a plurality of through holes 214 opposite to the receiving passages 2040. The cover 210 defines a second guide slot 216 through the cover 210 opposite to the first guide slot 206 of the base. The second guide slot 216 has a substantially same shape as the first guide slot 206 of the base, but has a smaller width compared to the fist one. The cover 210 forms a protruding block 217 and is provided with a substantially trapezium configuration. The first receiving cavity 209 is disposed at one side of the cover 210 relative to the base 200, and the second receiving cavity 219 is defined in the first cavity for receiving the actuator 220 together with the first receiving cavity 209.

The actuator 220 includes a head 222, a linking portion 224 extending downwardly from the head 222, a mounting portion 226 defined on a distal end of the linking portion 224 and a retaining ring 205 mating with the mounting portion 226 for retaining the actuator 220 received in the first and second receiving cavities. The head 222 is cylindrical and defines a long narrow groove for receiving an actuate member and urging the cover 210 to slide relative to the base from the open position to the closed position.

Figure 2:
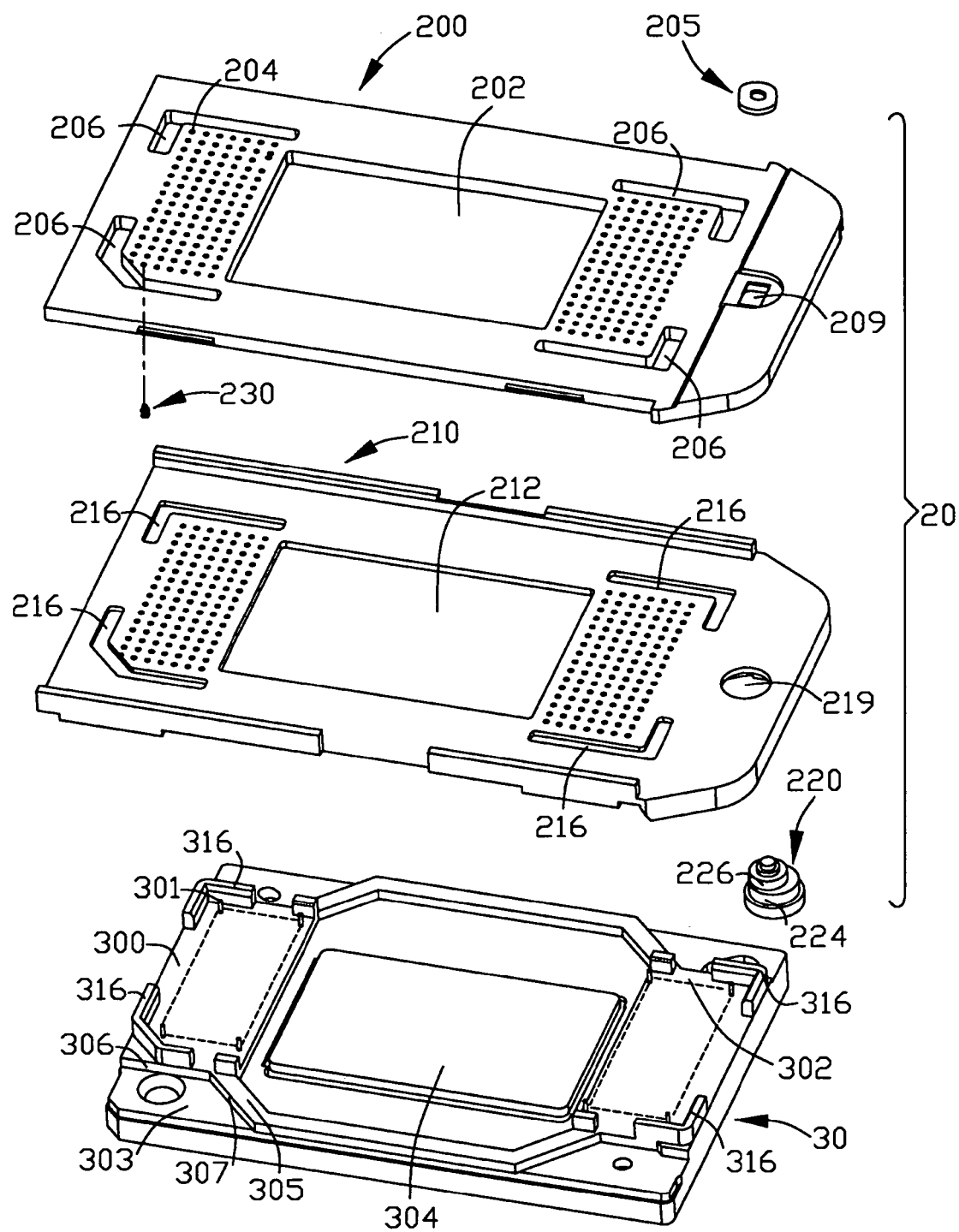
FIG. 2 is a view similar to FIG. 1, but from another perspective.

Referring to FIG. 2, the chip module 30 comprises a radiating surface 304 defined in a center of the chip module 30 for dissipating heat, and an abutting portion 300 disposed in the radiating surface 304. The abutting portion 300 defines a plurality of pins 301 and an abutting surface 302. The plurality of pins 301 is similarly arranged in a rectangular array. The through holes 214 of the cover 210 and the receiving passages 2040 of the base 200 extend from the abutting portion 300 along a same direction. A guiding wall 316 extends along the same direction of the pins 301 and is disposed in the outside of the abutting portion 300. The guiding wall 316 has a same profile and dimension to the second guide slot 216 of the cover 210 of the connector 20 and the first guide slot 206 of the base 200. A distance between the guiding wall 316 and the abutting surface 302 is greater than that of the pins extending from the abutting surface 302 but smaller than a total thickness of the cover 210 plus the base 200. And a recessed area 303 is defined in one end of the abutting portion 300 corresponding to the protruding block 217. The recessed area 303 and the protruding block 217 have the same profiles. The chip module 30 also defines a rib 305 in a position between two recessed areas 303. A first profile 306 is disposed between the recessed area 303 and the abutting portion 300, and a second profile 307 is disposed between the recessed area 303 and the rib 305. The profiles 306, 307 are formed with a cascade configuration, and define an equal height in a direction along which the chip module 30 mates with the connector 20. The height is greater than the height of the protruding block 217. The first profile 306 contacts with one side of the protruding block 217 and the second profile 307 contacts with another side of the protruding block 217. After the chip module 30 is mounted onto the connector, the guiding wall 316 passes through the second guide slot 216 and inserts into the first guide slot 206, while an end of the guiding wall 316 does not overstep the second guide slot 216. The thickness of the guiding wall 316 is substantially equal to the width of the second guide slot 216 but smaller than the width of the first guide slot 206. The protruding block 217 of the cover 210 does not contact with the recessed area 303.

An assembling process will be detailedly described hereunder referring to FIG. 1 in accordance with the present invention. Firstly, the conductive contacts 230 are received in the corresponding receiving passages 2040 of the base 200. Then the cover 210 is mounted onto the base 200 with the second rectangular placket 210 of the cover 210 aligning with the first rectangular placket 202 of the base 200, and the second receiving cavity 219 of the cover 210 aligning with the first receiving cavity 209 of the base 200. Finally, the actuator 220 is inserted into the second receiving cavity 219 of the cover 210 and the first receiving cavity 209 in turn and is retained in the base 200 and the cover 210 by virtue of the retaining ring 205 of the actuator 220.

Figure 3:
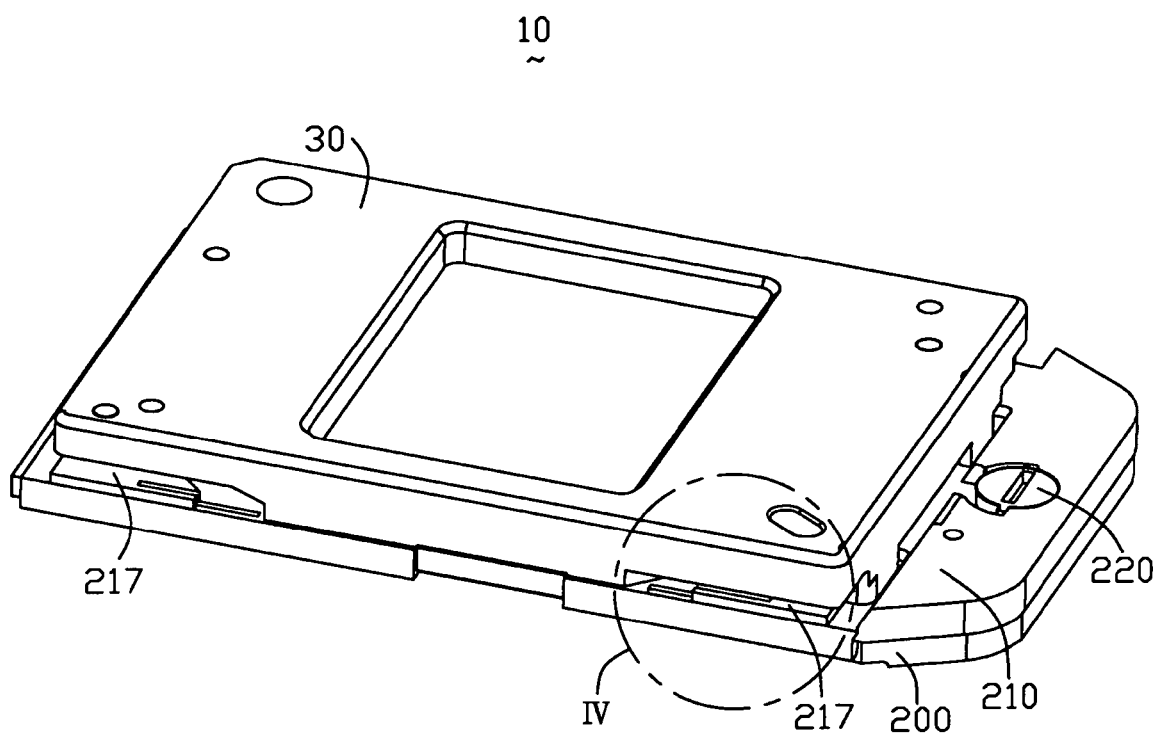
FIG. 3 is an assembly view of FIG. 1.
Figure 4:
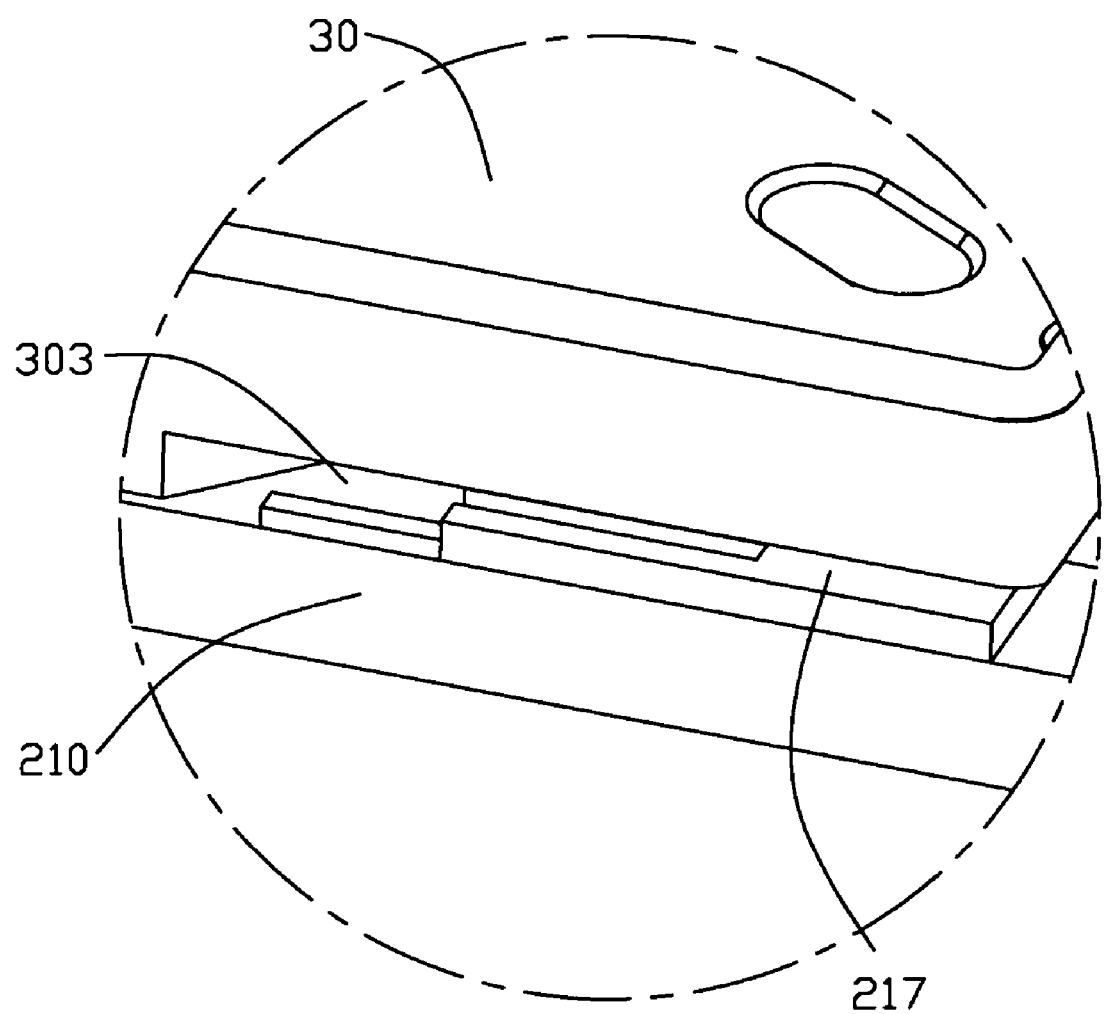
FIG. 4 is an enlarged view of the circled portion IV of FIG. 3.

Hereunder, it will describe how the connector 20 of the connector assembly 10 electrically connects with the chip module 30, referring to FIGS. 1, 3 and 4. Firstly, the cover is at the open position driven by the actuator 220. Secondly, the guiding walls 316 of the chip module 20 are inserted into the corresponding second guide slot 216 and are contacted with the sidewalls of the second guide slot 216. At the same time, the pins 301 of the chip module 30 are not inserted into the through holes 214. After that, the chip module 30 is pressed downwardly to make the guiding wall 316 slide into the first guide slot 206, and the pins 3010 of the chip module 30 are inserted into the corresponding receiving passages 2040 of the base. Meanwhile, the pins 301 are not electrically connected with the conductive contacts 230 received in the receiving passages 2040. In the above-mentioned inserting process, if the pins 301 of the chip module 30 were inclined, the side of the protruding block 217 will properly guide the first profile 306 of the abutting portion 300 and the second profile 307 of the ribs 305 for protecting the chip module 30 against damage. Thereby, the pins 301 of the chip module 30 could avoid being destroyed even though the module is slantwise inserted into the receiving passage 2040. When the chip module 30 connects with the cover 210 completely, because the pins 301 do not contact with the contacts 230 received in the connector, the chip module can insert into the connector in a manner of zero insertion force. Lastly, the actuator 220 drives the cover 210 to the closed position and, at the same time, the pins 301 of the chip module 30 are contacted with the corresponding conductive contacts 230 and electrical connection between the chip module 30 and the connector 20 is accordingly established.

According to the assembly process of the preferred embodiment in accordance with the present invention, the connection between the guiding wall 316 and the second guide slot 216 is established earlier than the insertion of the pins 301 of the chip module 30 through the through holes 214 defined in the cover 210. Thereby, the chip module 30 can be conveniently and accurately mounted onto the connector 20 by virtue of the guiding wall 316 of the chip module 30 mating with the second guide slot 216 of the cover 210. Furthermore, the pins 301 of the chip module 30 can avoid being destroyed because of the protruding block 217 defined on the cover 210. And the guiding wall propping the corresponding sidewall of the second guide lot 216 can protect the contact from being destroyed even when the chip is improperly pressed.

Furthermore, although the present invention has been described with the preferred embodiment referring to FIGS. 1–4, it is not to be construed as being limited thereto and has other alterations. For instance, the through holes of the cover could define a plurality of guiding walls around, and a plurality of guide slots disposed at the chip module for receiving a plurality of guiding walls. As long as the engagement between the guiding walls and the guide slot is earlier than the engagement between the pins of the chip module and through holes of the cover, the chip module can also be conveniently and accurately mounted onto the connector and can achieve a function of detecting the contacts. In addition, the protruding block and the recess could be formed in other shapes, such as triangle, rectangle and so on.

Furthermore, in other embodiments in accordance with the present invention, the through holes of the cover and the guide slot is not in a same plane, meanwhile, the distance of the guiding walls of the chip module corresponding to the mating surface is substantially equal with the distance of the chip module corresponding to the mating surface.

What is claimed is:

1. An electrical connector assembly comprising:
   a connector comprising a base with a plurality of passageways receiving a plurality of conductive contacts, a cover mounted on the base, the cover defining a plurality of through holes corresponding to the passageways, and an actuator for driving the cover to move from an open position to a closed position;
   a chip module mounted on the connector and including an abutting surface resting on the cover and a plurality of pins extending from the abutting surface;
   wherein a first guiding device is defined on the chip module and a second guiding device is defined on the connector for engaging with the first guiding device along an engaging direction, and a length of the two guiding devices along the engaging direction is longer than that of the pins, and wherein the module is provided with a first guider and the connector is provided with a second guider, and the two guiders have different heights in the engaging direction; wherein the first guider is provided with a plurality of protruding blocks projecting from a surface of the cover and has a trapezoid shape, while the second guider is formed in ladder shape and includes an abutting portion, a recessed area, a plurality of ribs; and a plurality of sidewalls are disposed between the abutting portion and the recessed area and are disposed between the recessed area and the ribs, a height of the sidewalls being higher than that of the first guider.

2. The electrical connector assembly as claimed in claim 1, wherein the first guider is provided with a plurality of protruding blocks projecting from a surface of the cover and has a trapezoid shape, while the second guider is formed in ladder shape and includes an abutting portion, a recessed area, a plurality of ribs; and a plurality of sidewalls are disposed between the abutting portion and the recessed area and are disposed between the recessed area and the ribs, a height of the sidewalls being higher than that of the first guider.

3. The electrical connector assembly as claimed in claim 1, wherein the first guiding device includes a plurality of guiding walls extending from the surface of the module in the extending direction of the pins; and the second guiding device includes a first guide slot defined on the base and a second guide slot defined on the cover, a distance from the guide walls to the surface of the package being greater than a length of the pin extending from the abutting surface.

4. The electrical connector assembly as claimed in claim 3, wherein at least one guiding wall disposed on the chip module has a different shape from others.

5. The electrical connector assembly as claimed in claim 4, wherein the guiding walls are disposed symmetrically at the four corners externally of the pins.

6. The electrical connector assembly as claimed in claim 5, wherein the first guiding device defines a plurality of guide slots disposed in the chip module, while the second guiding device defines a plurality of guide walls disposed on the cover corresponding to the guide slots of the chip module, and a length of the guide walls extending from the top surface of the cover is greater than a length of the pins extending from the abutting surface.

7. The electrical connector assembly as claimed in claim 6, wherein the guide walls are disposed outside of the array of through holes of the cover.

8. The electrical contact as claimed in claim 1, wherein at least one guiding wall disposed in the connector has a different shape from others.

9. An electrical connector assembly comprising:
   an electrical connector including:
       an insulative base defining a first groove;
       a plurality of contacts disposed in the base;
       an insulative cover mounted upon the base and defining a second groove in alignment with the first groove and a plurality of through holes in alignment with the corresponding contacts, respectively; and
   a chip module seated upon the cover, said chip module defining a plurality of electronic pins downwardly extending through the through holes and contacting the contacts, respectively, and a protrusion downwardly extending through the second groove and into the first groove; wherein
   a length of said protrusion is larger than those of the electronic pins so that engagement between the protrusion and the second groove occurs before that between the electronic pins and the through holes, thus assuring that the electronic pins will be correctly inserted respectively into the corresponding through holes without tilting when the chip module is assembled to the connector.

10. An electrical connector assembly comprising:
    an electrical connector including:
        an insulative base;
        a plurality of contacts disposed in the base;
        an insulative cover mounted upon the base and defining a first vertical guidance device, and a plurality of through holes in alignment with the corresponding contacts, respectively; and
    a chip module seated upon the cover, said chip module defining a plurality of electronic pins downwardly extending through the through holes and contacting the contacts, respectively, and a second vertical guidance device in alignment with the first vertical guidance device; wherein
    when the chip module is vertically assembled to the connector, engagement between the first and second vertical guidance devices occurs before that between the electronic pins and the through holes, thus assuring that the electronic pins will be correctly inserted respectively into the corresponding through holes without tilting.

11. The assembly as claimed in claim 10, wherein the cover defines an upward mating surface on which the chip module is seated upon the upward mating surface when said chip module is assembled to the connector.

12. The assembly as claimed in claim 11, wherein the engagement between the first and second vertical guidance devices occurs below said upward mating surface.

13. The assembly as claimed in claim 12, wherein said base further defines a third vertical guidance device and said chip module further defines a fourth vertical guidance engaged with said third vertical guidance device, and engagement between said third and fourth vertical guidance devices occurs above said upward mating surface.

* * * * *